United States Patent
Shimizu

(10) Patent No.: US 10,403,358 B2
(45) Date of Patent: Sep. 3, 2019

(54) SEMICONDUCTOR MEMORY DEVICE

(71) Applicant: TOSHIBA MEMORY CORPORATION, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/905,258

(22) Filed: Feb. 26, 2018

(65) Prior Publication Data

US 2019/0080757 A1    Mar. 14, 2019

(30) Foreign Application Priority Data

Sep. 8, 2017   (JP) .................. 2017-173420

(51) Int. Cl.
*G11C 7/22* (2006.01)
*G11C 13/00* (2006.01)

(52) U.S. Cl.
CPC ........ *G11C 13/0069* (2013.01); *G11C 13/004* (2013.01); *G11C 13/0064* (2013.01); *G11C 2013/0045* (2013.01); *G11C 2013/0066* (2013.01); *G11C 2013/0083* (2013.01)

(58) Field of Classification Search
CPC .. G11C 16/0475; G11C 16/0491; G11C 16/10
See application file for complete search history.

(56) References Cited

U.S. PATENT DOCUMENTS

| | | | |
|---|---|---|---|
| 7,542,339 B2 | 6/2009 | Miwa et al. | |
| 8,189,401 B2 | 5/2012 | Fukuda | |
| 9,069,719 B2 | 6/2015 | Ong | |
| 9,251,898 B2 | 2/2016 | Katayama et al. | |
| 10,121,551 B1* | 11/2018 | Miller | G11C 16/3431 |
| 2003/0161192 A1* | 8/2003 | Kobayashi | G11C 16/0475 365/200 |
| 2018/0322940 A1* | 11/2018 | Kim | G11C 29/52 |

FOREIGN PATENT DOCUMENTS

| | | |
|---|---|---|
| JP | 2010218637 A | 9/2010 |
| JP | 4739940 B2 | 8/2011 |
| WO | 2012108185 A1 | 8/2012 |

* cited by examiner

*Primary Examiner* — Tuan T Nguyen
(74) *Attorney, Agent, or Firm* — Kim & Stewart LLP

(57) ABSTRACT

According to one embodiment, a semiconductor memory device includes a nonvolatile memory comprising a plurality of memory cells, and a controller configured to perform, a preliminary write process of writing reverse data into a first memory cell, and a main write process of writing correct data in the first memory cell, when the first memory cell is in a weak bit state, wherein a condition of the preliminary write process is different from a condition of the main write process.

14 Claims, 15 Drawing Sheets

SEMICONDUCTOR MEMORY DEVICE

CROSS-REFERENCE TO RELATED APPLICATION

This application is based upon and claims the benefit of priority from Japanese Patent Application No. 2017-173420, filed Sep. 8, 2017, the entire contents of which are incorporated herein by reference.

FIELD

Embodiments described herein relate generally to a semiconductor memory device.

BACKGROUND

In a semiconductor memory device having a nonvolatile memory including a plurality of memory cells, the write state of data in the memory cell may change over time. It is desired to improve data retention (data retention property) in the memory cell.

DETAILED DESCRIPTION

Embodiments provide a semiconductor memory device capable of improving data retention in a memory cell.

In general, according to one embodiment, a semiconductor memory device includes a nonvolatile memory comprising a plurality of memory cells, and a controller configured to perform, a preliminary write process of writing reverse data into a first memory cell, and a main write process of writing correct data in the first memory cell, when the first memory cell is in a weak bit state, wherein a condition of the preliminary write process is different from a condition of the main write process.

Hereinafter, a semiconductor memory device according to example embodiments will be described with reference to the accompanying drawings. It is noted that the present disclosure is not limited to these example embodiments.

EMBODIMENTS

A semiconductor memory device according to embodiments will be described. The semiconductor memory device includes a nonvolatile memory having a plurality of the memory cells. In the semiconductor memory device, the write state of data in the memory cell can change over time, and it is desired to improve the data retention (data retention property). The semiconductor memory device includes a function of a retention mode in order to improve reliability of the data retention.

In the retention mode, a memory cell which is erroneously read at a preset read margin level is read again at a verification level during a normal write process. As a method thereof, the retention mode performs a preliminary write process before the normal write process (main write process). That is, the retention mode is executed by performing the normal write process (main write process) of writing the proper data, i.e., data at a correct voltage within a desired range, after the preliminary write process of writing reverse data (data in which a bit value is reversed with respect to proper data) is performed with respect to a memory cell of an object. Therefore, a total processing time in the retention mode tends to take substantially twice as long as a processing time of a normal mode in which the preliminary write process is not performed.

In the embodiment, the total processing time of the retention mode is reduced by performing the preliminary write process in the retention mode for performing the preliminary write process and the main write process under a condition that the preliminary write process is completed in a shorter time than the main write process.

Figure 1:
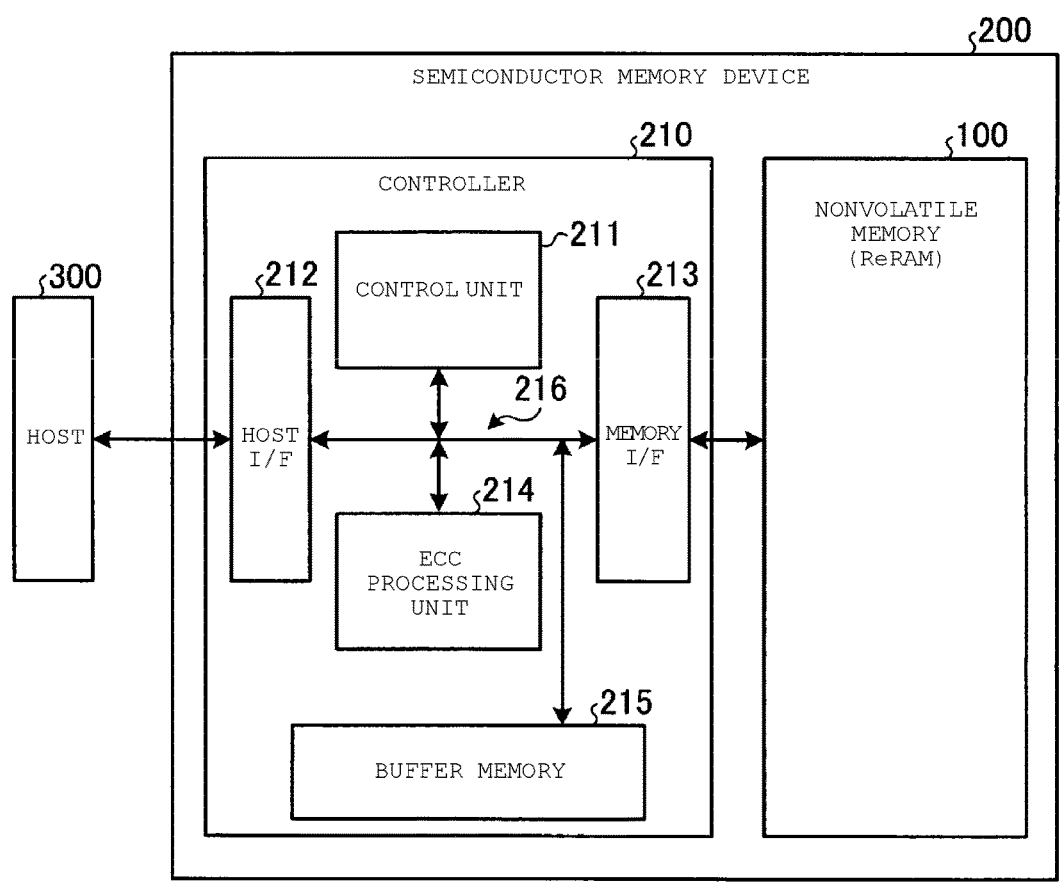
FIG. 1 is a diagram depicting a semiconductor memory device according to an embodiment.

Specifically, a semiconductor memory device 200 has a configuration as illustrated in FIG. 1. FIG. 1 is a diagram illustrating a configuration of the semiconductor memory device 200. The semiconductor memory device 200 is communicably connected to a host 300 and functions as an external storage medium with respect to the host 300. The semiconductor memory device 200 includes a nonvolatile memory 100 and a controller 210. The controller 210 controls the nonvolatile memory 100 in response to a request from the host 300 or autonomously.

The controller 210 includes a control unit 211, a host interface (I/F) 212, a memory interface (I/F) 213, an error correction (ECC) processing unit 214, a buffer memory 215, and a bus 216. The control unit 211, the host I/F (interface) 212, the memory I/F (interface) 213, the ECC (error correction) processing unit 214, and the buffer memory 215 are communicably connected to each other via the bus 216. The control unit 211 is, for example, a central processing computation unit (CPU) and integrally controls each unit in the controller 210. The host I/F 212 mediates communication with the host 300. The memory I/F 213 mediates delivery of data and instructions to and from the nonvolatile memory 100. The ECC processing unit 214 performs an error correction process for data read from the nonvolatile memory 100. The buffer memory 215 buffers delivery of data and instructions to and from the nonvolatile memory 100, and is used as a work area by the control unit 211.

Figure 2:
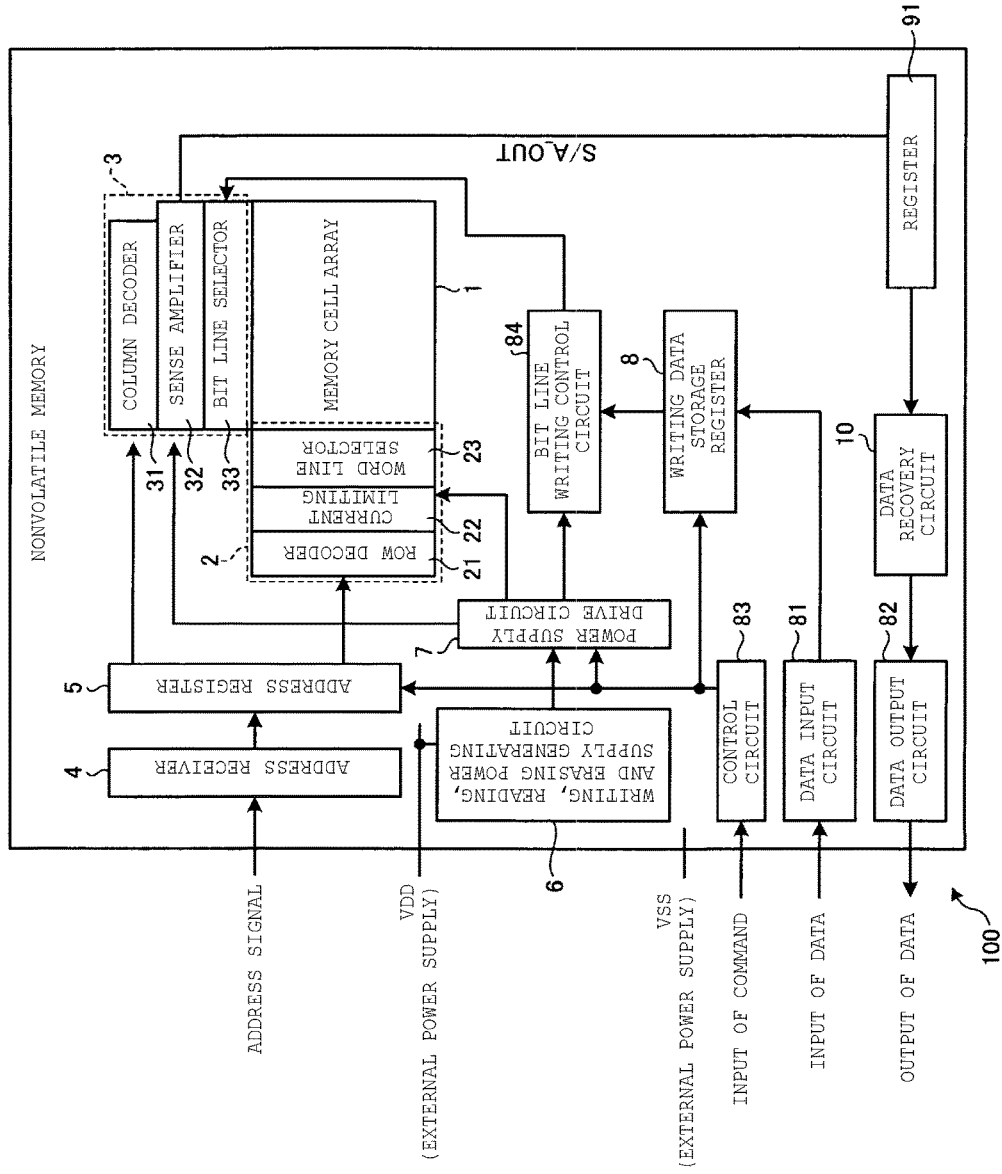
FIG. 2 is a diagram depicting a nonvolatile memory in the embodiment.
Figure 3:
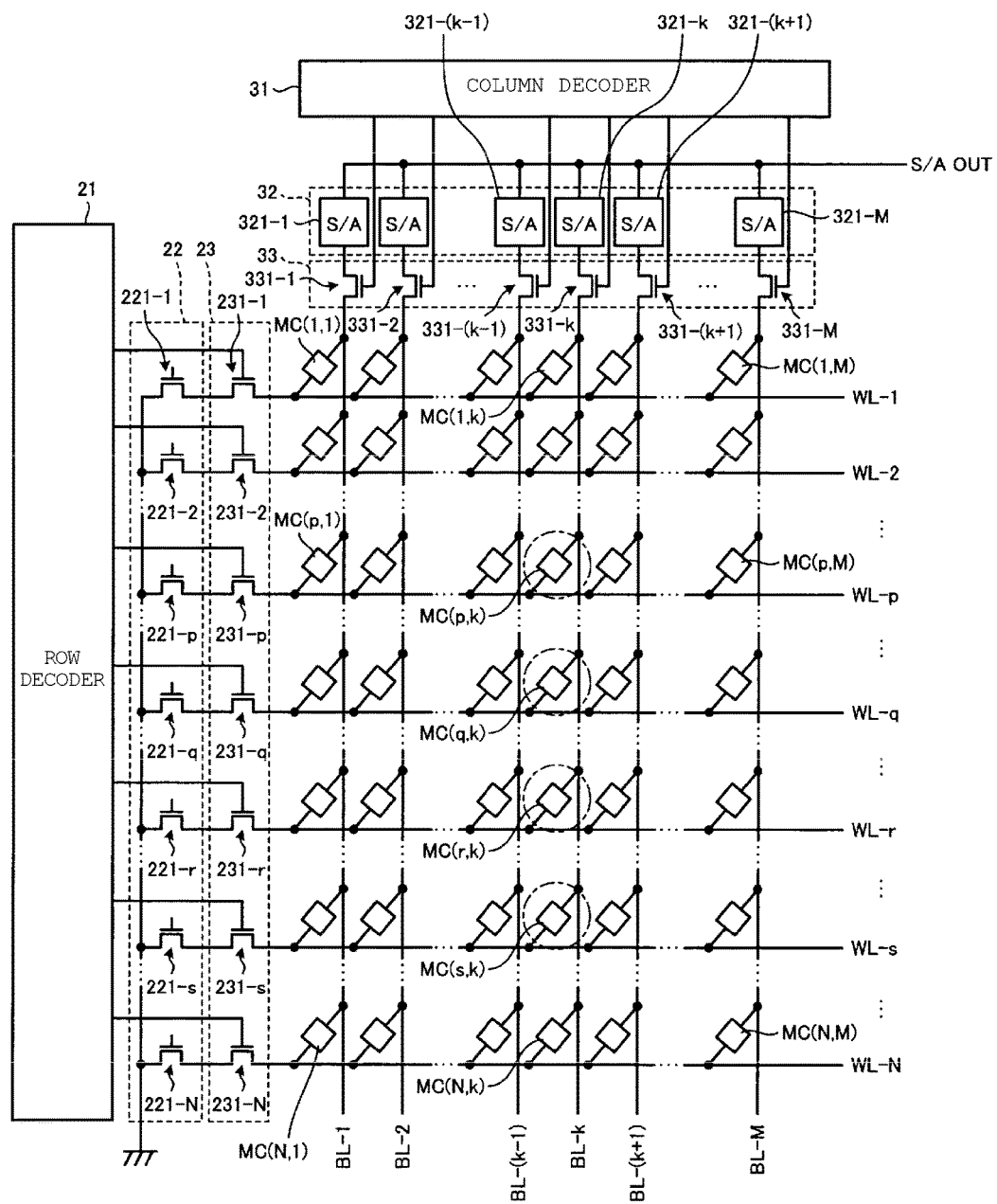
FIG. 3 is a diagram depicting a memory cell array in the embodiment.
Figure 4:
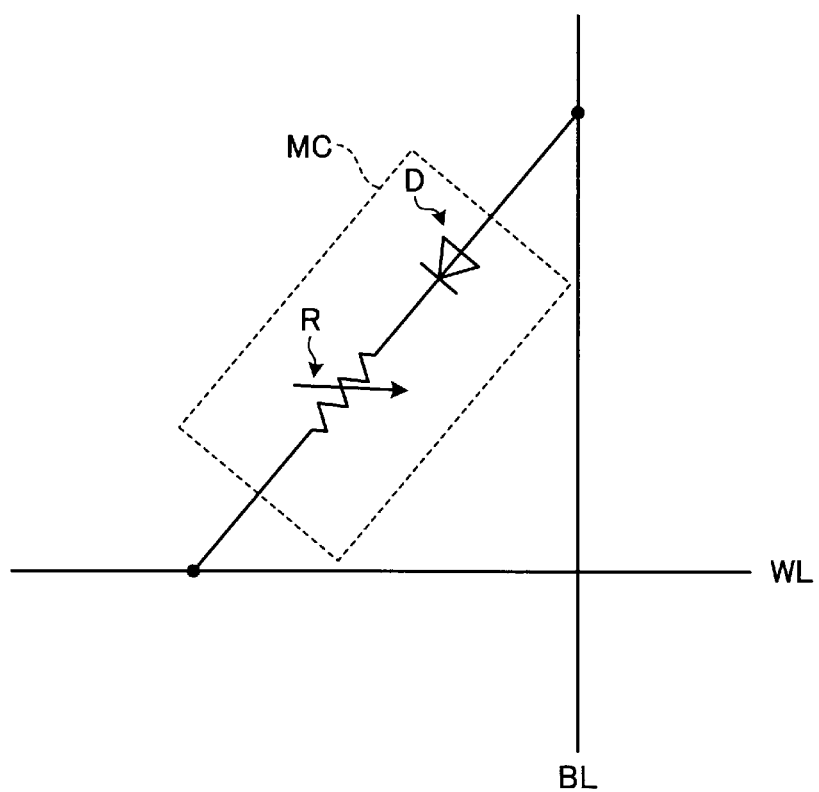
FIG. 4 is a circuit diagram depicting of a memory cell in the embodiment.

Next, the nonvolatile memory 100 will be described with reference to FIGS. 2 to 4. FIG. 2 is a diagram illustrating a configuration of the nonvolatile memory 100. FIG. 3 is a diagram illustrating a configuration of a memory cell array 1. FIG. 4 is a circuit diagram illustrating a configuration of a memory cell MC.

The nonvolatile memory 100 is, for example, a Resistance Random Access Memory (ReRAM) having the cross point type memory cell array 1. The nonvolatile memory 100 includes the memory cell array 1, a plurality of the word lines WL-1 to WL-N, a Row system circuit (control circuit) 2, a plurality of bit lines BL-1 to BL-M, a Column system circuit (reading circuit) 3, an address receiver 4, an address register 5, a writing, reading, and erasing power supply generating circuit 6, a power supply drive circuit 7, a control circuit 83, a writing data storage register 8, a bit line writing control circuit 84, a data recovery circuit 10, a data input circuit 81, and a data output circuit 82. N is an integer of 4 or more and M is an integer of 2 or more.

As illustrated in FIG. 3, a plurality of memory cells MC(1,1) to MC (N,M) are arranged in the memory cell array 1. For example, the plurality of the memory cells MC(1,1) to MC(N,M) are two-dimensionally arranged at intersections of N total word lines WL-1 to WL-N and M total bit lines BL-1 to BL-M. Three-dimensional arrangement of the memory cells MC may be achieved by stacking a two-dimensional arrangement (referred to as a memory layer in some contexts) of the memory cells MC in the memory cell array 1.

As illustrated in FIG. 4, a rectifying element D and a resistance-variable element R are connected in series in the memory cell MC that is disposed at the intersection of the word line WL and the bit line BL. The rectifying element D is, for example, a diode, a cathode of which is connected to the resistance-variable element R, and an anode of which is connected to the bit line BL. The resistance-variable element R is configured so that one end is connected to the word line WL and the other end is connected to the rectifying element D.

The resistance-variable element R is an element the state of which transitions between two resistance values, for example, between the two resistance values of a low resistance state and a high resistance state. The resistance-variable element R transitions (writes and sets) from the high resistance state to the low resistance state, for example, when a constant set voltage at both ends of the memory cell MC is applied so that the rectifying element D is biased in a forward direction. In addition, the resistance-variable element R transitions (erases and resets) from the low resistance state to the high resistance state, for example, when a constant reset voltage at the both ends of the memory cell MC is applied so that the rectifying element D is biased in the forward direction. Therefore, each of the memory cells MC is capable of storing binary data.

In the present specification, an operation including a set operation and a reset operation is referred to as a write operation. The set operation is an operation to write a bit value "0" by applying a set voltage to both ends of the memory cell MC and the reset operation is an operation to write a bit value "1" by applying a reset voltage to the both ends of the memory cell MC. In addition, an operation including the set voltage or the reset voltage is referred to as a write voltage (program voltage).

It is noted that in FIG. 4, as a configuration of each of the memory cells MC, a configuration in which a direction from the bit line BL to the word line WL is the forward direction of the rectifying element D is illustrated as an example, but a configuration in which the direction from the bit line BL to the word line WL is a reverse direction of the rectifying element D may be provided. In addition, in each of the memory cells MC, the positions of the rectifying element D and the resistance-variable element R may be exchanged.

The address receiver 4 illustrated in FIG. 2 stores an address signal supplied from the outside in the address register 5. The control circuit 83 receives a command supplied from the outside and issues an instruction corresponding to the command to each circuit. For example, the control circuit 83 issues an instruction for controlling an operation voltage, an operation timing, or the like in the writing, reading, and erasing operations. The address register 5 sends the address signal to the Row system circuit 2 and the Column system circuit 3 according to an instruction from the control circuit 83.

The data input circuit 81 temporarily stores data (write data) input from the outside in the writing data storage register 8. The writing data storage register 8 sends data to the bit line writing control circuit 84 according to an instruction from the control circuit 83. The bit line writing control circuit 84 controls a voltage transferred from the power supply drive circuit 7.

The data output circuit 82 is connected to an external host (not illustrated) via an external I/O line and performs notification of an output of read data, completion of writing, and completion of erasing to the host.

The writing, reading, and erasing power supply generating circuit 6 generates each of the power supply voltages needed for writing, reading, and erasing, and supplies each of the power supply voltages to the power supply drive circuit 7.

The power supply drive circuit 7 supplies power supply voltages for writing, reading, and erasing to the Row system circuit 2 and the Column system circuit 3 according to an instruction from the control circuit 83.

The N word lines WL-1 to WL-N illustrated in FIG. 3 extend in a direction along a row between the plurality of the memory cells MC(1,1) to MC(N,M).

The Row system circuit 2 illustrated in FIG. 2 is provided at a position adjacent to an extending direction of the word line WL of the memory cell array 1. The Row system circuit 2 includes a row decoder 21, a current limiting block 22, and a word line selector 23. The row decoder 21 receives an address signal from the address register 5 and drives the appropriate word line WL via the word line selector 23 according to the address signal. In this case, the current limiting block 22 limits a current so that a current value flowing through the selected word line WL is a predetermined value.

The row decoder 21 includes N decoder circuits (not illustrated), the current limiting block 22 includes N current limiting elements 221-1 to 221-N, and the word line selector 23 includes N word line drivers 231-1 to 231-N corresponding to the N word lines WL-1 to WL-N. For example, the decoder circuit selects a word line WL-p via a word line driver 231-$p$ and applies a voltage necessary for erasing data of a memory cell, writing of data to a memory cell, and reading of data from a memory cell for a selected memory cell of a $p^{th}$ row in memory cells MC(p,1) to (p,M). Each of current limiting elements 221-1 to 221-N is, for example, an NMOS transistor, and a bias that operates in a linear region is supplied to a gate, and operates as an active load. Therefore, currents which are equal to each other can flow through the respective word lines WL when the corresponding memory cell MC turns on and a current flows.

The M bit lines BL-1 to BL-M illustrated in FIG. 3 extend in a direction along a column between the plurality of the memory cells MC(1,1) to MC(N,M).

The Column system circuit 3 illustrated in FIG. 2 is provided at a position adjacent to the extending direction of the bit line BL of the memory cell array 1. The Column system circuit 3 is connected to the M bit lines BL-1 to BL-M.

For example, the Column system circuit 3 includes a column decoder 31, a sense amplifier block 32, and a bit line selector 33. The column decoder 31 receives an address signal from the address register 5 and selects a bit line BL via the bit line selector 33 according to the address signal.

The sense amplifier block 32 includes M sense amplifiers (S/A) 321-1 to 321-M and the bit line selector 33 includes M bit line drivers 331-1 to 331-M corresponding to the M bit lines BL-1 to BL-M. For example, the column decoder 31 selects a bit line BL-k via a bit line driver 331-k and performs erasing of data of a memory cell, writing of data of the memory cell, and reading of data from the memory cell for the selected memory cell of a $k^{th}$ column in the memory cells MC(1,k) to MC(N,k). In addition, the column decoder 31 amplifies the read data via the sense amplifier 321 and outputs the amplified data to a retention circuit 9. Each of the sense amplifiers 321 outputs a detection result to the retention circuit 9.

Figure 5:
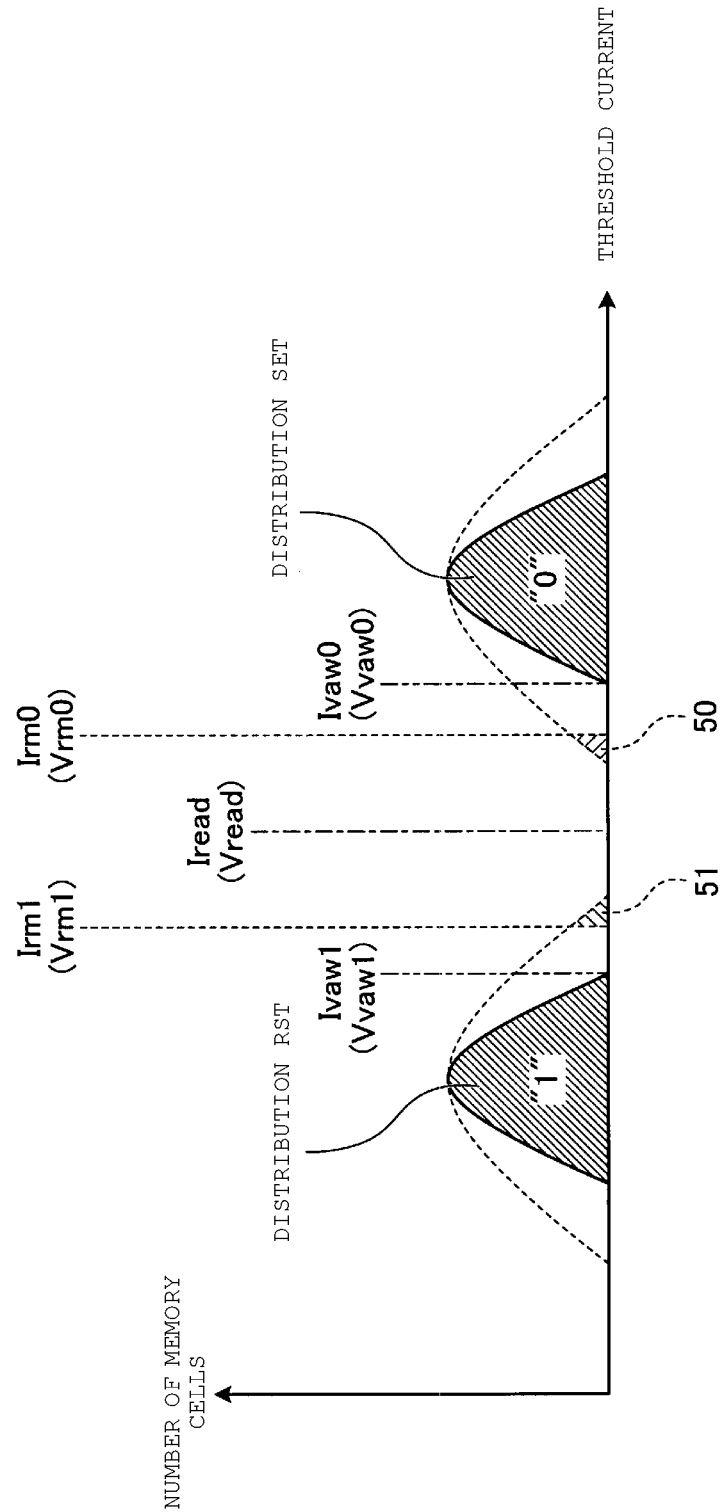
FIG. 5 is a explanatory graph for a memory cell (weak bit) in a weak write state.

Next, a memory cell (weak bit) that is in a weak write state in the plurality of the memory cells in the memory cell array 1 will be described with reference to FIG. 5. FIG. 5 is a graph for explaining the memory cell (weak bit) in the weak write state.

A bit value (written value of 0 or 1) written into each of the memory cells in the memory cell array 1 is sense-amplified by current detection. A threshold current is indicated on the horizontal axis and the number of the memory cells indicated on the vertical axis, and the threshold current distribution of the plurality of the memory cells in the memory cell array 1 is illustrated in FIG. 5. The distribution curve of the bit value "0" indicated by an inclined hatching is referred to as a distribution SET of the threshold currents of the memory cells in the set state (low resistance state) and the distribution curve of the bit value "1" indicated by a inclined hatching is referred to as a distribution RST of the threshold currents of the memory cells in the reset state (high resistance state).

The read operation for reading data from a memory cell is performed by applying a read voltage Vread to both ends of the memory cell and checking whether or not the resulting current value is lower than a read current Iread.

For example, if the proper data is supposed to be "0", when a read current value is higher than the read current Iread corresponding to a current boundary between 0 and 1, it is read as "0". When the distribution SET changes over time from that indicated by a curved solid line to that indicated by a curved broken line, in a memory cell that is in a region 50 located on a distribution RST side with respect to the original distribution SET, the read current value is higher than Iread so that it is read as "0", but if the distribution SET is left as it is, there is a possibility that the threshold current deteriorates so as to approach the current boundary, to become close to "1" side of the boundary. Therefore, in the present specification, the memory cell that is in the region 50 is referred to as a weak bit with respect to a memory cell in the weak write state.

The state of a memory cell being in the region 50 can be confirmed by the fact that the read current value is between the read current Iread corresponding to the read voltage Vread and a read current Irm0 corresponding to a preliminary read voltage Vrm0.

Similarly, if the proper data is supposed to be "1", when the read current value is lower than the read current Iread, it is read as "1". When the distribution RST changes over time from the state indicated by a curved solid line to the state indicated by the curved broken line, a memory cell that is in a region 51 located on a distribution SET side with respect to the original distribution RST is lower than the read current Iread so that it is read as "1", but if the distribution RST is left as it is, there is a possibility that the threshold current deteriorates so as to approach the "0" side of the boundary. Therefore, in the present specification, the memory cell that is in the region 51 is referred to as a weak bit with respect to a memory cell in the weak write state.

The memory cell in the region 51 has a verification status NG, i.e., not good, in the verification operation in which a verification voltage Vvaw is applied to the both ends of the memory cell with respect to the distribution RST, but the memory cell status or sense can be detected by confirming that the bit value is read as "0" by the preliminary read voltage Vrm0 in the preliminary read operation.

The status of the memory cell in the region 51 can be confirmed by the fact that the read current value is between the read current Iread corresponding to the read voltage Vread and a read current Irm1 corresponding to a preliminary read voltage Vrm1.

Figure 6:
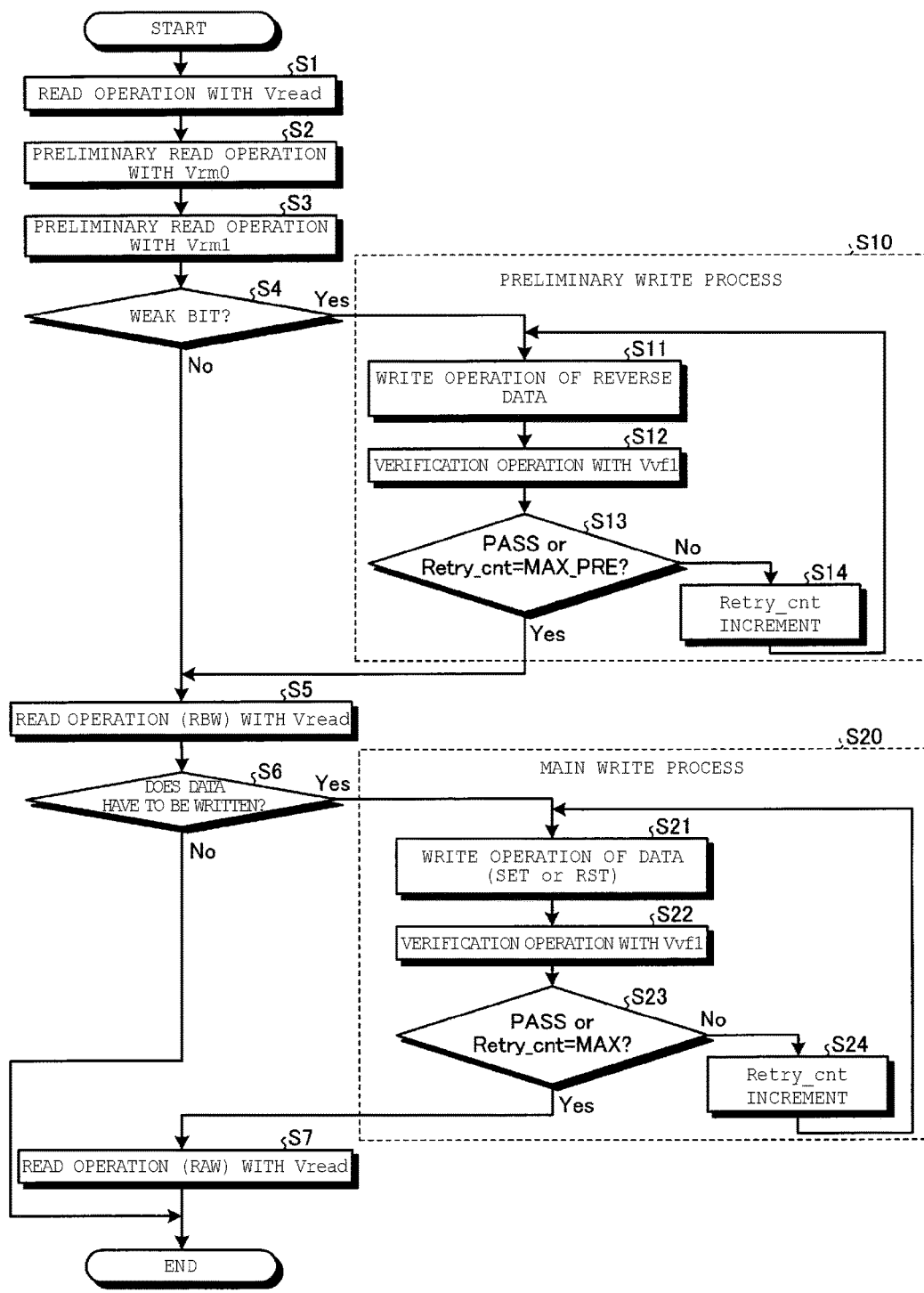
FIG. 6 is a flowchart illustrating aspects of an operation of the semiconductor memory device according to an embodiment.

Next, an operation of the semiconductor memory device 200 will be described with reference to FIG. 6. FIG. 6 is a flowchart illustrating the operation of the semiconductor memory device 200.

The controller 210 in the semiconductor memory device 200 switches an operate mode from a normal mode to a retention mode in response to a request from the host 300 or autonomously (for example, periodically, for improving the reliability of the data retention). The controller 210 detects the weak bit in the retention mode. The controller 210 performs the read operation with the read voltage Vread (S1), performs the preliminary read operation with the preliminary read voltage Vrm0 (S2), performs the preliminary read operation with preliminary read voltage Vrm1 (S3), and determines whether or not the memory cell to be detected is a weak bit based on read results of S1 to S3 (S4).

Figure 7A:
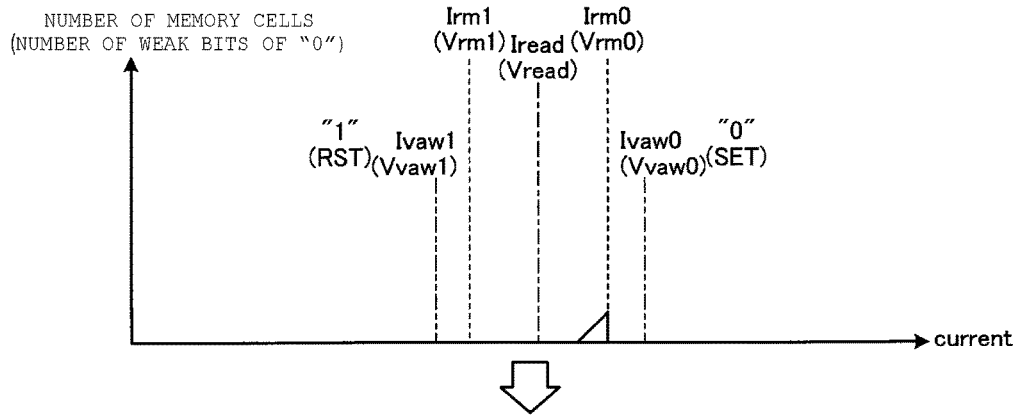
FIGS. 7A to 7C are graphs illustrating aspects of an operation of the semiconductor memory device with respect to a weak bit of "0" in an embodiment.
Figure 7B:
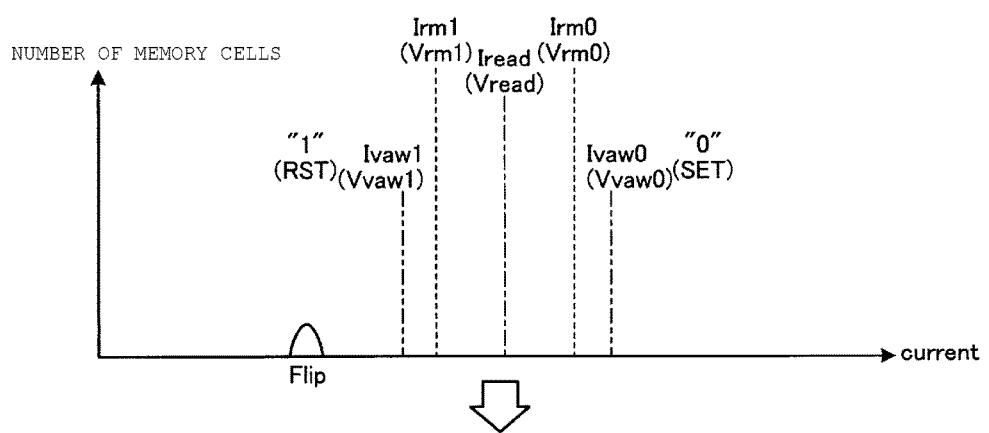
Figure 7C:
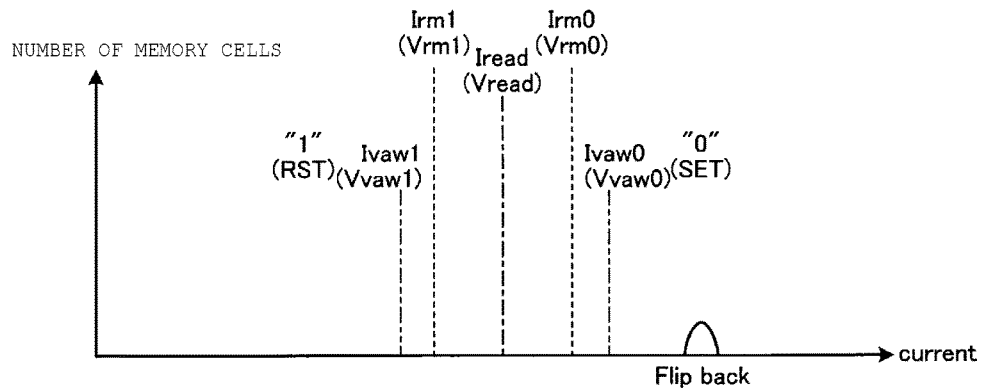

For example, as illustrated in FIG. 7A, if an expected value of the memory cell is 0, when the controller 210 reads 0 in the read operation of S1 (Vread) and reads 1 in the read operation of S2 (Vrm0), it is determined that the memory cell is the weak bit (Yes in S4), and when the controller 210 reads 0 in the read operation of S1 (Vread) and reads 0 in the read operation of S2 (Vrm0), it is determined that the memory cell is not the weak bit (No in S4). FIGS. 7A to 7C are graphs illustrating an operation of the semiconductor memory device 200 with respect to the weak bit of "0".

Figure 8A:
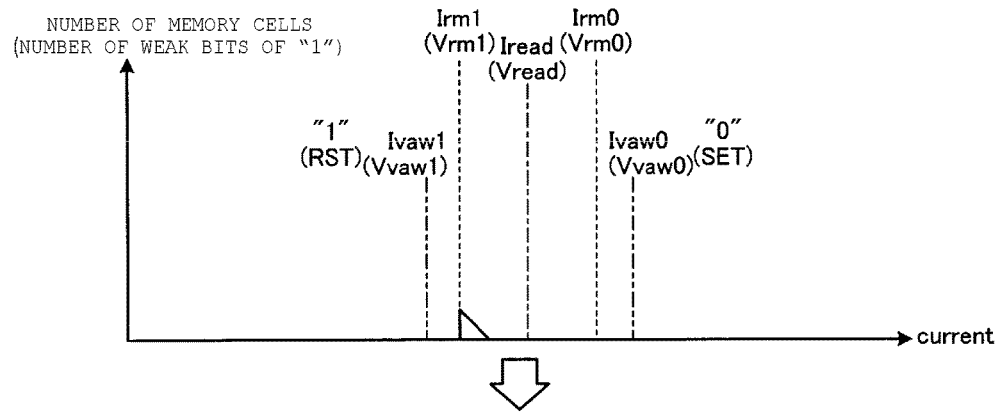
FIGS. 8A to 8C are graphs illustrating aspects of an operation of the semiconductor memory device with respect to a weak bit of "1" in an embodiment.
Figure 8B:
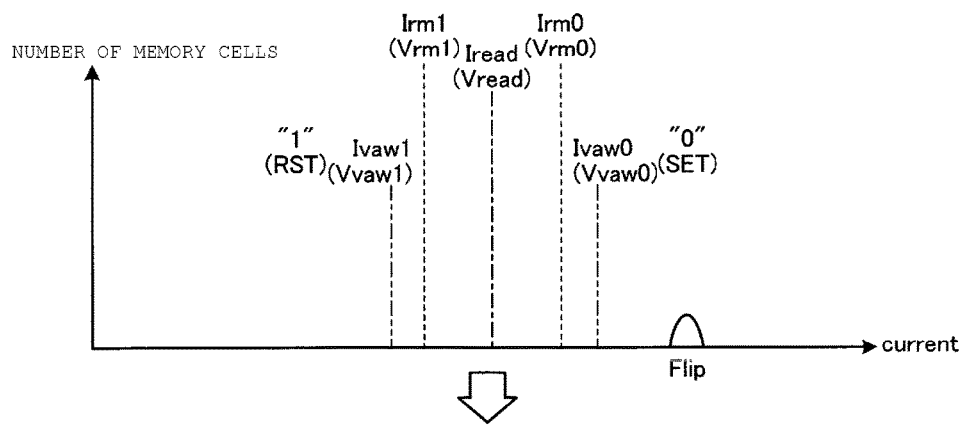
Figure 8C:
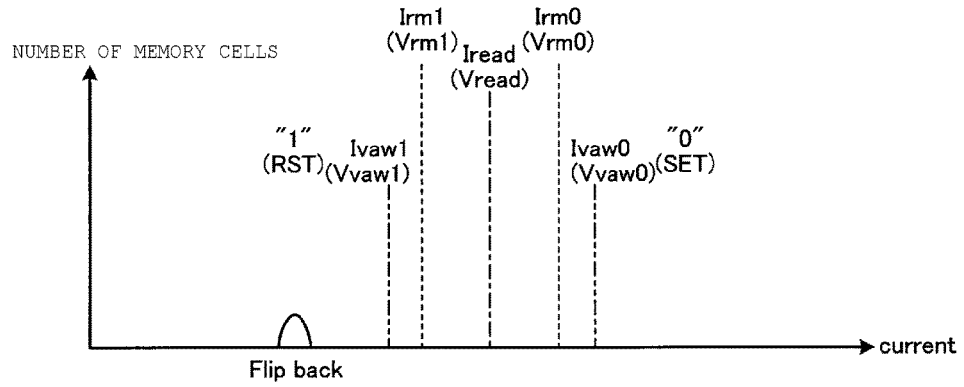

For example, as illustrated in FIG. 8A, if the expected value of the memory cell is 1, when the controller 210 reads 1 in the read operation of S1 (Vread) and reads 0 in the read operation of S2 (Vrm0), it is determined that the memory cell is a weak bit (Yes in S4), and when the controller 210 reads 1 in the read operation of S1 (Vread) and reads 1 in the read operation of S2 (Vrm0), it is determined that the memory cell is not a weak bit (No in S4). FIGS. 8A to 8C are graphs illustrating an operation of the semiconductor memory device 200 with respect to a weak bit of value "1".

If it is determined that the memory cell is a weak bit (Yes in S4), the controller 210 sets an initial value "1" in a retry number counter Retry_cnt and performs the preliminary write process (S10).

In S10, the controller 210 performs a write operation of writing reverse data, i.e., data opposite to that which is ultimately intended to be written into the memory cell, to the memory cell (Flip operation) (S11). For example, the controller 210 writes 1 if the expected value is 0 and writes 0 if the expected value is 1. The controller 210 performs the verification operation (VAW: Verify After Write) with the verification voltage Vvf1 (S12). For example, as illustrated in FIG. 7B, if the expected value is 0, the controller 210 performs the verification operation with the verification voltage Vvf1=Vvaw1 and if the read current is smaller than Iyaw1, it becomes verified as OK and if the read current is greater than Ivaw1, it becomes verified as NG. As illustrated in FIG. 8B, if the expected value is 1, the controller 210 performs the verification operation with the verification voltage Vvf1=Vvaw0 and if the read current is greater than Ivaw0, it becomes verified as OK and if the read current is smaller than Ivaw0, it becomes verified as NG.

The controller 210 determines whether or not at least one of a first condition indicating that the memory cell is verified as OK and a second condition indicating that the retry number counter Retry_cnt reaches a retry number threshold value MAX_PRE is satisfied (S13). When none of the first condition and the second condition are satisfied (No in S13), the controller 210 increments the retry number counter Retry_cnt (S14) and returns the process to S11, and when at least one of the first condition and the second condition is satisfied (Yes in S13), the controller 210 completes the preliminary write process (S10).

When it is determined as No in S4 or when the preliminary write process (S10) is completed, the controller 210 performs the read operation (RBW: Read Before Write) with the read voltage Vread (S5) and determines whether or not data has to be written to the memory cell (S6). When the expected value and the value of the data read from the memory cell match with each other, the controller 210 does not need to write data (No in S6) and completes the process.

When the expected value and the value of the data read from the memory cell do not match with each other, it is necessary to write data (Yes in S6) and the controller 210 sets the initial value "1" in the retry number counter Retry_cnt and performs the main write process (S20).

In S20, the controller 210 performs the write operation (Flip back operation for the weak bit) of writing data as expected to the memory cell (S21). For example, the controller 210 writes 0 if the expected value is 0 and writes 1 if the expected value is 1. The controller 210 performs the verification operation (VAW: Verify After Write) using the verification voltage Vvf1 (S22). For example, as illustrated in FIG. 7C, if the expected value is 0, the controller 210 performs the verification operation using the verification voltage Vvf1=Vvaw0 and if the read current is smaller than Ivaw0, it becomes verified as NG and if the read current is greater than Ivaw0, it becomes verified as OK. As illustrated in FIG. 8C, if the expected value is 1, the controller 210 performs the verification operation with the verification voltage Vvf1=Vvaw1 and if the read current is greater than Ivaw1, it becomes verified as NG and if the read current is smaller than Ivaw1, it becomes verified as OK.

The controller 210 determines whether or not at least one of the first condition indicating that the memory cell is verified as OK and the second condition indicating that the retry number counter Retry_cnt reaches a retry number threshold value MAX is satisfied (S23). When none of the first condition and the second condition are satisfied (No in S23), the controller 210 increments the retry number counter Retry_cnt (S24) and returns the process to S21, and when at least one of the first condition and the second condition is satisfied (Yes in S23), the controller 210 completes the main write process (S20).

When the main write process (S20) is completed, the controller 210 performs the read operation (RAW: Read After Write) with the read voltage Vread (S7), stores a PASS/FAIL flag indicating whether or not the main write process (S20) is successful, and completes the process.

Here, the retry number threshold value MAX_PRE in the preliminary write process (S10) can be set to be the number of times less than the retry number threshold value MAX in the main write process (S20). Therefore, a time required for the preliminary write process (S10) can be shortened more than a time required for the main write process (S20) and the processing time of the retention mode can be reduced with respect to the processing time of the normal mode.

As described above, in the semiconductor memory device 200, the preliminary write process in the retention mode (in which the preliminary write process and the main write process are both performed) is performed under the condition that the preliminary write process is completed in a shorter time than the main write process. Therefore, the total processing time of the retention mode can be reduced and thus the processing time of the retention mode can be reduced with respect to the processing time of the normal mode.

It is noted that, a case where each sense amplifier (S/A) performs the sense amplifier operation based on the current detection is illustrated as an example, but the concept of the embodiment can also be similarly applied when each sense amplifier (S/A) performs the sense amplifier operation based on voltage detection.

Figure 9:
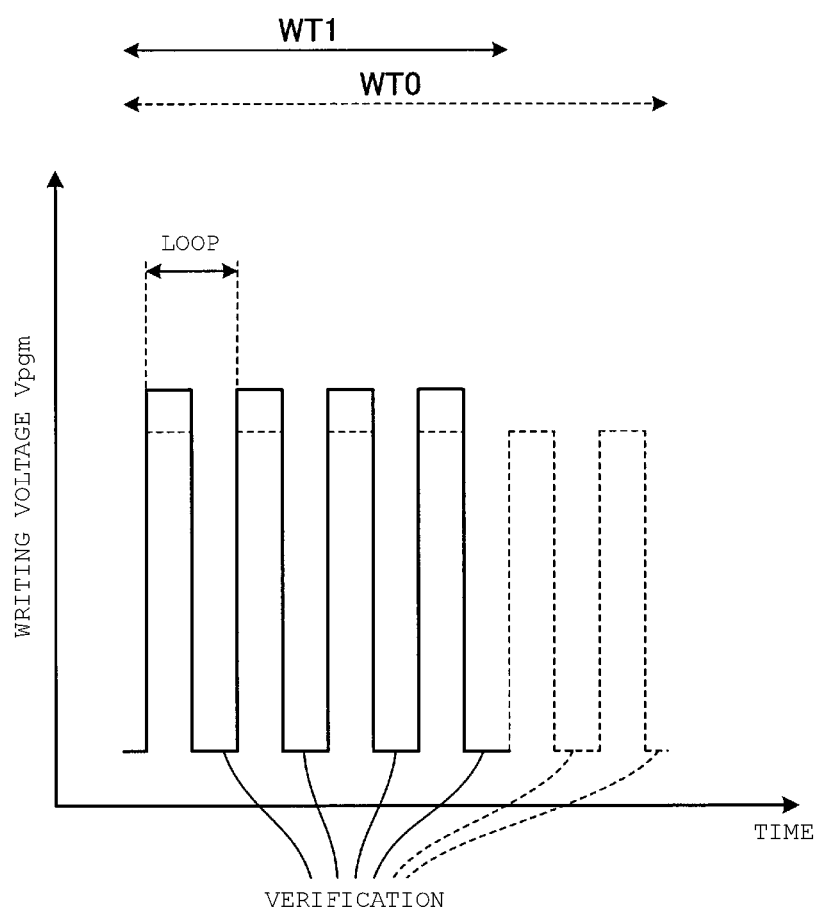
FIG. 9 is a graph illustrating a condition under which writing is promoted in an embodiment.

Alternatively, the write operation (S11) in the preliminary write process (S10) may be performed under a condition under which writing is promoted from the write operation (S21) in the main write process (S20). For example, as illustrated in FIG. 9, the write voltage Vpgm of the write operation (S11) indicated by a solid line may be higher than the write voltage of the write operation (S21) indicated by a broken line. FIG. 9 is a graph illustrating a condition under which writing is promoted. Also in this case, the time WT1 of the preliminary write process (S10) can be shortened to be shorter than the time WT0 of the main write process (S20). It is noted that in FIG. 9, a loop including the write operation and the verification operation corresponds to the loop process of S11 to S14 illustrated in FIG. 6.

Figure 10:
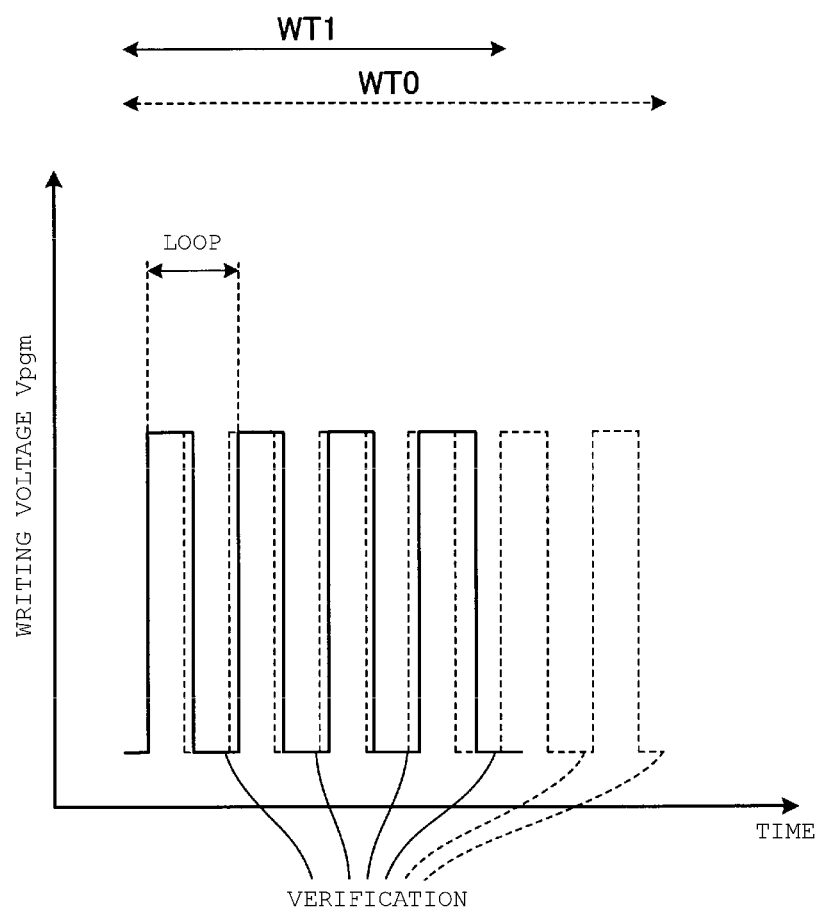
FIG. 10 is a graph illustrating a condition under which writing is promoted in an embodiment.

Alternatively, as illustrated in FIG. 10, the writing time of the write operation (S11) indicated by a solid line may be longer than a writing time of the write operation (S21) indicated by a broken line. FIG. 10 is a graph illustrating a condition under which writing is promoted. Also in this case, the time WT1 of the preliminary write process (S10) can be less than the time WT0 of the main write process (S20).

Figure 11:
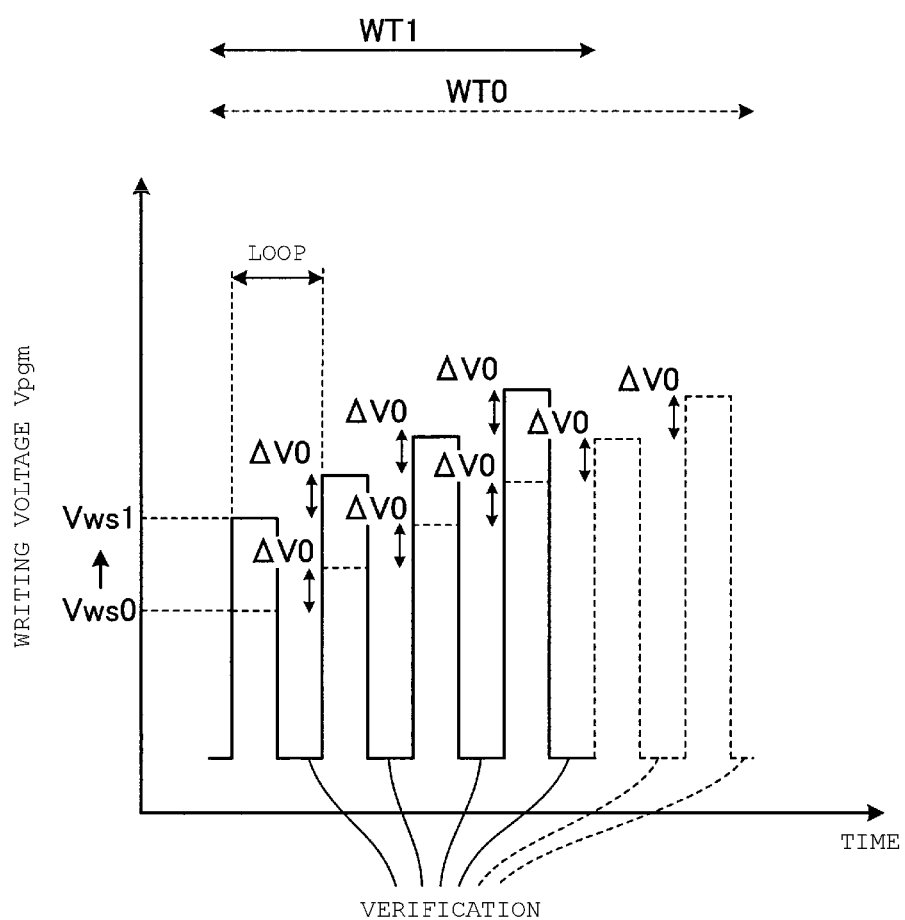
FIG. 11 is a graph illustrating a condition under which writing is promoted in an embodiment.

Alternatively, as illustrated in FIG. 11, if the write operation and the verification operation are alternately repeated while the write voltage is increased by a step width ΔV0 in each of the preliminary write process (S10) and the main write process (S20), a write start voltage Vws1 of the write operation (S11) indicated by a solid line may be higher than a write start voltage Vws0 of the write operation (S21) indicated by a broken line. FIG. 11 is a graph illustrating a condition under which writing is promoted. Also in this case, the time WT1 of the preliminary write process (S10) can be shortened to be less than the time WT0 of the main write process (S20).

Figure 12:
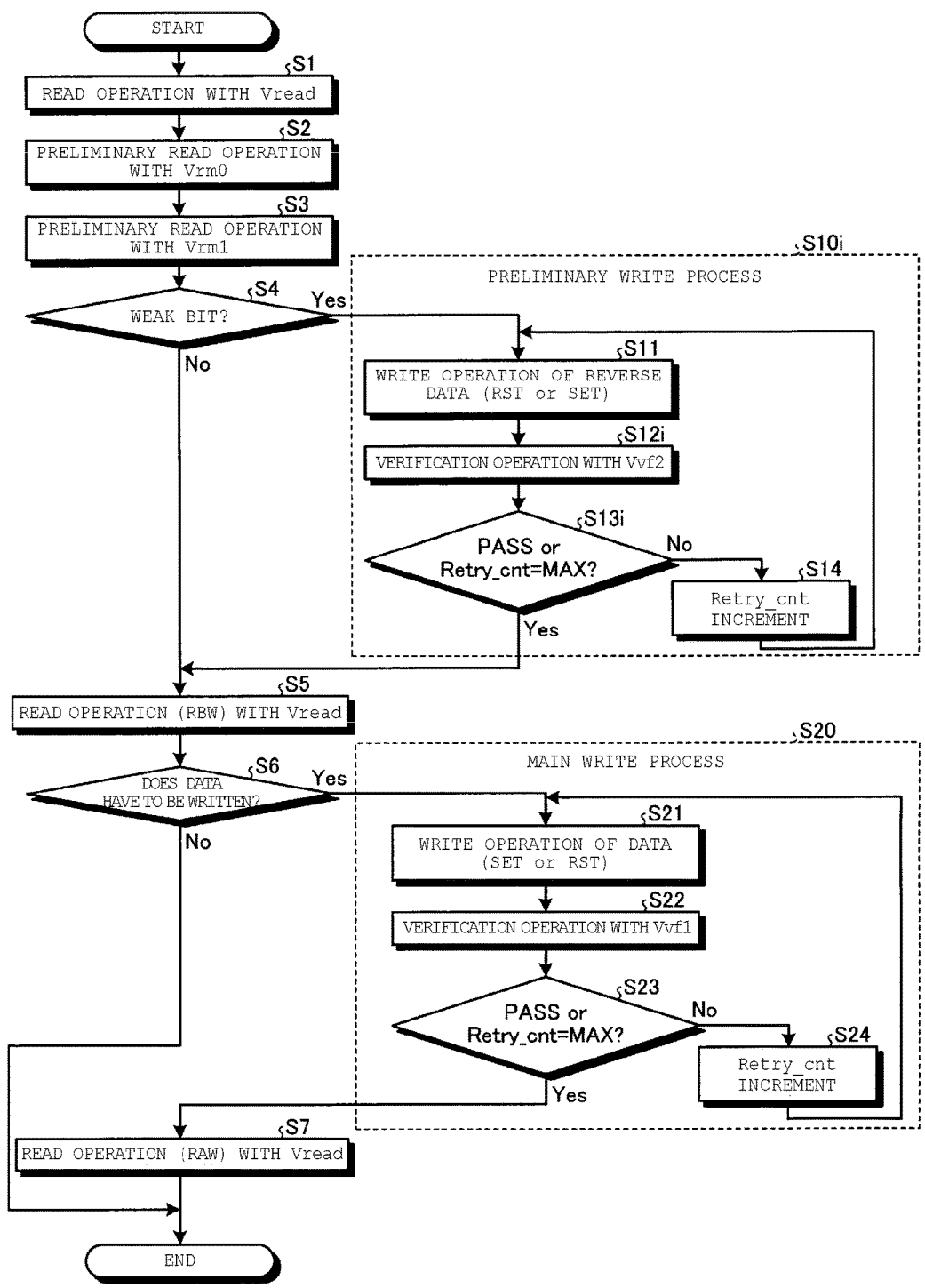
FIG. 12 is a flowchart illustrating an operation of a semiconductor memory device according to a modification example of an embodiment.

Alternatively, as illustrated in FIG. 12, the retry number threshold value in S13i of the preliminary write process (S10i) is the same as the retry number threshold value in S23 of the main write process (S20), but the verification voltage Vvf2 of the verification operation (S12i) of the preliminary write process (S10i) may be reduced more than the verification voltage VVf1 of the verification operation (S22) of the main write process (S20). FIG. 12 is a flowchart illustrating an operation of a semiconductor memory device 200. For example, the verification voltage Vvf2=Vread can be set. In this case, verified as OK tends to occur with the verification operation (S12i) of the preliminary write process (S10i) compared to the verification operation (S22) of the main write process (S20). As a result, the number of times of retry of the preliminary write process (S10i) can be reduced to less than the number of times of retry of the main write process (S20), the time required for the preliminary write process (S10i) can be reduced to less than the time required for the main write process (S20), and the processing time of the retention mode can be reduced with respect to the processing time of the normal mode.

Figure 13:
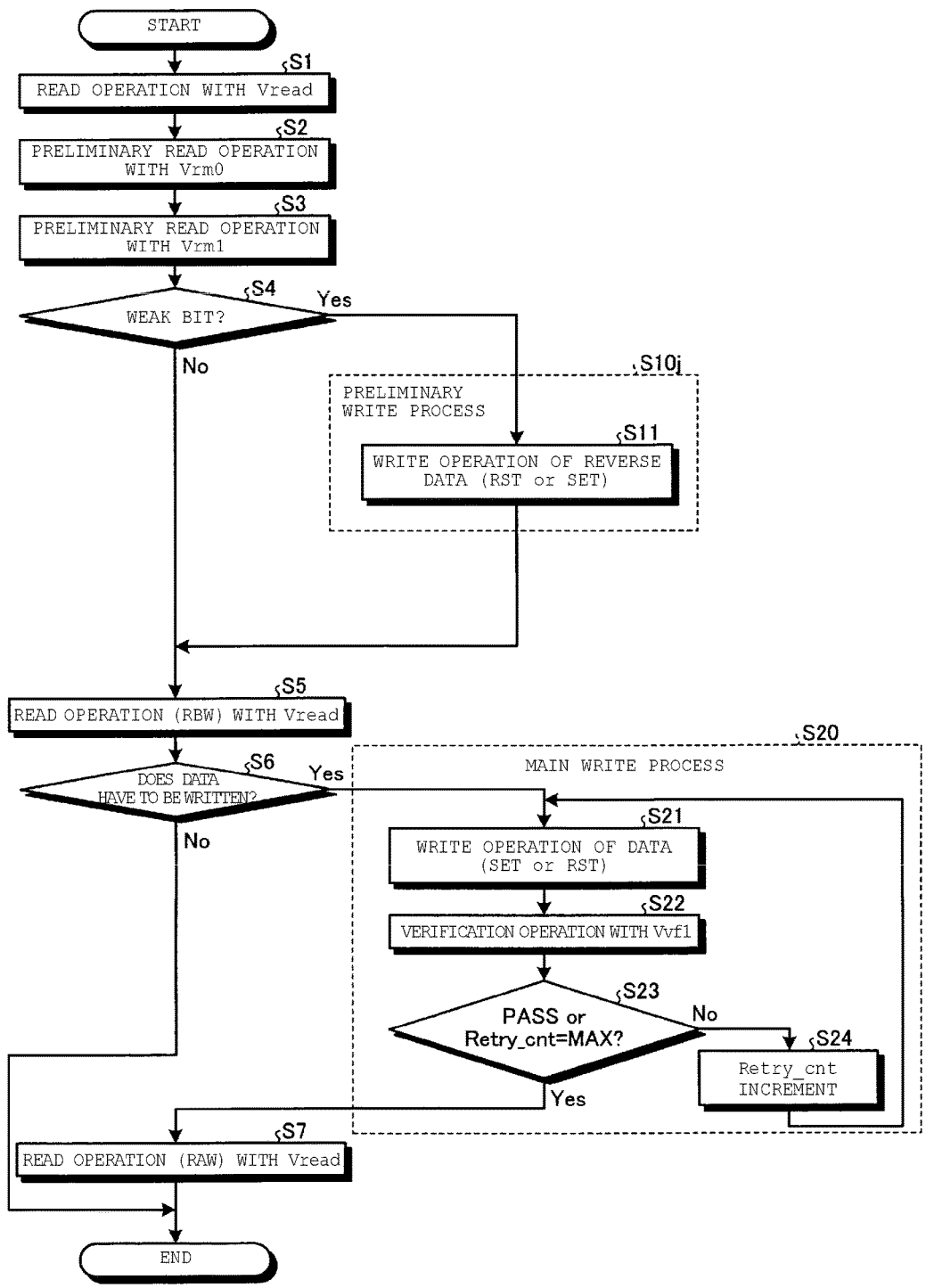
FIG. 13 is a flowchart illustrating an operation of a semiconductor memory device according to another modification example of an embodiment.

Alternatively, as illustrated in FIG. 13, the write operation (S11) is performed with the preliminary write process (S10j) and then the preliminary write process (S10j) may be completed without performing S12 to S14. FIG. 13 is a flowchart illustrating an operation of a semiconductor memory device 200. In this case, the number of times of execution of the preliminary write process (S10j) is one (no retry). As a result, the number of times of retry of the preliminary write process (S10j) can be reduced to less than the number of times of retry of the main write process (S20), the time required for the preliminary write process (S10j) can be shortened to less than the time required for the main write process (S20), and the processing time of the retention mode can be reduced with respect to the processing time of the normal mode.

Figure 14:
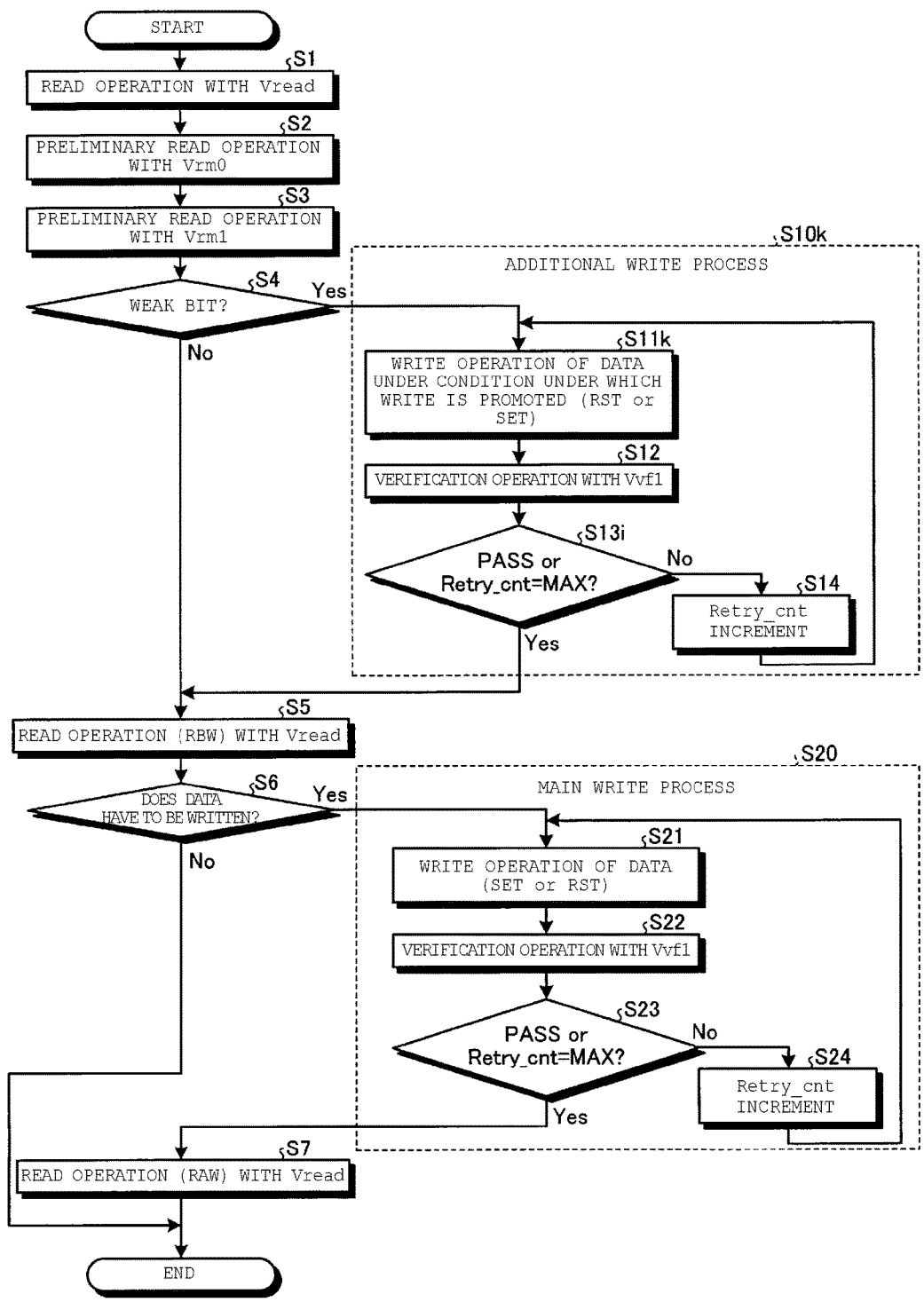
FIG. 14 is a flowchart illustrating an operation of a semiconductor memory device according to still another modification example of an embodiment.
Figure 15A:
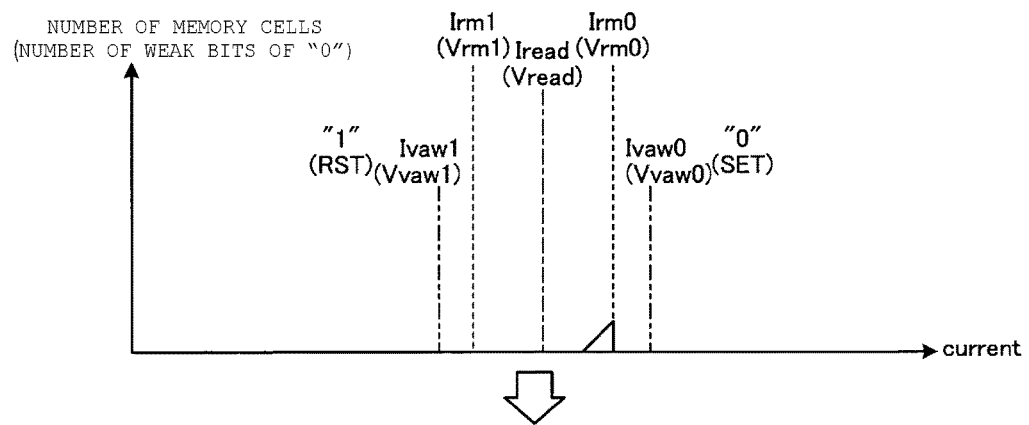
FIGS. 15A and 15B are graphs illustrating an operation of a semiconductor memory device according to still another modification example of an embodiment.
Figure 15B:
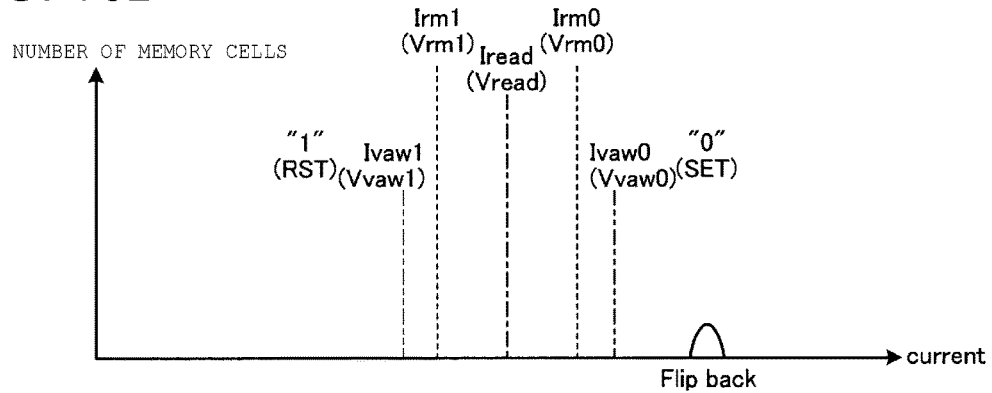

Alternatively, as illustrated in FIG. 14, if it is determined that the memory cell is the weak bit in S4 (Yes in S4), an additional write process (S10k) may be performed instead of the preliminary write process (S10i). FIG. 14 is a flowchart illustrating an operation of the semiconductor memory device 200. As illustrated in FIG. 15, in the additional write process (S10k), a write operation (Flip back operation) of writing data as the expected value instead of the reverse data under a condition under which writing is performed is provided (S11k). FIGS. 15A and 15B are graphs illustrating an operation of a semiconductor memory device 200. Conditions for performing writing are, for example, the conditions as illustrated in FIGS. 9 to 11. Therefore, a weak bit is determined as No in S6 and the main write process (S20) can be omitted so that the total processing time of the retention mode can be greatly reduced, and an increase in the processing time of the retention mode with respect to the processing time of the normal mode can be surely prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a nonvolatile memory comprising a plurality of memory cells including a first memory cell, each memory cell configured to store data as a value of 1 or 0, wherein a current corresponding to a value 1 and a current corresponding to a value 0 each have a current value range when correctly written, and the current value range of one of the values increases over time such that a portion of the current value range approaches the current value range of the other value; and
a controller configured to:
apply a read voltage to both ends of the first memory cell and determine whether or not the resulting current value is lower than a read current, and
apply a preliminary read voltage to both ends of the first memory cell and determine whether or not the resulting current value is lower than a read current, wherein
the controller is further configured to perform, if the resulting current value as read by applying the read voltage is less than the read current and the resulting current value as read by applying the preliminary read voltage is greater than the read current, or if the resulting current value as read by applying the read voltage is greater than the read current and the resulting current value as read by applying the preliminary read voltage is less than the read current:
a preliminary write process of writing reverse data into the first memory cell; and
a main write process of writing the correct data in the first memory cell, wherein
a condition of the preliminary write process is different from a condition of the main write process.

2. The semiconductor memory device according to claim 1, wherein the controller is further configured to, if the resulting current value read by applying the read voltage is less than the read current and the resulting current value read by applying the preliminary read voltage is less than the read current, or if the resulting current value read by applying the read voltage is greater than the read current and the resulting current value read by applying the preliminary read voltage is greater than the read current:
apply a read voltage to both ends of a second memory cell and determine whether or not the resulting current value is lower than a read current; and
apply a preliminary read voltage to both ends of a second memory cell and determine whether or not the resulting current value is lower than a read current.

3. The semiconductor memory device according to claim 1, wherein
the controller is further configured to, in the preliminary write process and the main write process, alternately repeat a write operation and a verification operation, and
the number of repetitions of the write operation and the verification operation in the preliminary write process is less than the number of repetitions of the write operation and the verification operation in the main write process.

4. The semiconductor memory device according to claim 1, wherein the controller is further configured to alternately repeat a write operation and a verification operation in the preliminary write process and the main write process, and a verification voltage used for the verification operation in the preliminary write process is closer to a voltage corresponding to a boundary of a threshold distribution of the current read from memory cells than a verification voltage used for the verification operation in the main write process.

5. The semiconductor memory device according to claim 1, wherein the controller is further configured to perform a write operation and not perform a verification operation in the preliminary write process, and the write operation and the verification operation are alternately repeated in the main write process.

6. The semiconductor memory device according to claim 1, wherein the controller is further configured to perform each of a writing of correct data in the first memory cell and a writing of data in a second memory cell in the main write process.

7. The semiconductor memory device according to claim 1, wherein the controller is further configured to write data using a first condition in the main write process, and write data using a second condition which is different than the first condition in the preliminary write process.

8. The semiconductor memory device of claim 7, wherein the second condition is a different voltage than the voltage of the first main write process.

9. A method of operating a semiconductor memory device comprising a nonvolatile memory comprising a plurality of memory cells, each memory cell configured to store data as a value of 1 or a 0, wherein a current corresponding to a value 1 and a current corresponding to a value 0 each have a current value range when correctly written, and the current value range of one of the values increases over time such that a portion of the current value range of one of the values approaches the current value range of the other value, comprising:

applying a read voltage to both ends of a first memory cell and determining whether or not the resulting current value is lower than a read current;

applying a preliminary read voltage to both ends of a first memory cell and determining whether or not the resulting current value is lower than a read current; and if the resulting current value read by applying the read voltage is less than the read current and the resulting current value read by applying the preliminary read voltage is greater than the read current, or if the resulting current value read by applying the read voltage is greater than the read current, and the resulting current value read by applying the preliminary read voltage is less than the read current:

performing a preliminary write process of writing reverse data into the first memory cell; and performing a main write process of writing the correct data in the first memory cell, wherein a condition of the preliminary write process is different from a condition of the main write process.

10. The method of operating a semiconductor memory device according to claim 9, wherein if the resulting current value read by applying the read voltage is less than the read current and the resulting current value read by applying the preliminary read voltage is less than the read current, or if the resulting current value read by applying the read voltage is greater than the read current and the resulting current value read by applying the preliminary read voltage is greater than the read current:

applying a read voltage to both ends of a second memory cell and determine whether or not the resulting current value is lower than a read current; and applying a preliminary read voltage to both ends of a second memory cell and determine whether or not the resulting current value is lower than a read current.

11. The method of operating a semiconductor memory device according to claim 9, further comprising:

alternately repeating a write operation and a verification operation in the preliminary write process and the main write process; and the number of repetitions of the write operation and the verification operation in the preliminary write process is smaller than the number of repetitions of the write operation and the verification operation in the main write process.

12. The method of operating a semiconductor memory device according to claim 9, further comprising:

alternately repeating a write operation and a verification operation in the preliminary write process and the main write process, wherein a verification voltage used for the verification operation in the preliminary write process is closer to a voltage corresponding to a boundary of a threshold distribution of the current read from memory cells than a verification voltage used for the verification operation in the main write process.

13. The method of operating a semiconductor memory device according to claim 9, further comprising:

performing a write operation and not performing a verification operation in the preliminary write process, wherein the write operation and the verification operation are alternately repeated in the main write process.

14. The method of operating a semiconductor memory device according to claim 9, further comprising:

performing each of a writing of correct data in the first memory cell and a writing of data in a second memory cell in the main write process.

* * * * *